(12) United States Patent
Kautzsch

(10) Patent No.: US 9,318,633 B2
(45) Date of Patent: Apr. 19, 2016

(54) PHOTODETECTOR WITH CONTROLLABLE SPECTRAL RESPONSE

(71) Applicant: Infineon Technologies AG, Neubiberg (DE)

(72) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/574,792

(22) Filed: Dec. 18, 2014

(65) Prior Publication Data

US 2015/0103349 A1    Apr. 16, 2015

Related U.S. Application Data

(63) Continuation of application No. 13/232,564, filed on Sep. 14, 2011, now Pat. No. 8,916,873.

(51) Int. Cl.
| | |
|---|---|
| *H01L 31/0224* | (2006.01) |
| *H01L 31/0352* | (2006.01) |
| *H01L 27/146* | (2006.01) |
| *H01L 31/102* | (2006.01) |
| *G01J 3/50* | (2006.01) |

(52) U.S. Cl.
CPC .............. *H01L 31/03529* (2013.01); *G01J 3/50* (2013.01); *H01L 27/1463* (2013.01); *H01L 27/1464* (2013.01); *H01L 31/0224* (2013.01); *H01L 31/0352* (2013.01); *H01L 31/102* (2013.01)

(58) Field of Classification Search
CPC ..................... H01L 31/02162; H01L 31/02024
See application file for complete search history.

(56) References Cited

U.S. PATENT DOCUMENTS

| | | | |
|---|---|---|---|
| 5,430,321 | A   | 7/1995  | Effelsberg |
| 6,803,557 | B1* | 10/2004 | Taylor ............... H01L 27/14618 |
| | | | 250/208.1 |
| 2004/0201009 | A1 | 10/2004 | Hsu et al. |
| 2005/0045910 | A1 |  3/2005 | Taylor et al. |
| 2005/0230722 | A1 | 10/2005 | Najda et al. |

(Continued)

FOREIGN PATENT DOCUMENTS

| | | |
|---|---|---|
| CN | 101385119 A   | 3/2009 |
| WO | 2005078801 A1 | 8/2005 |
| WO | 2008129433 A2 | 10/2008 |

OTHER PUBLICATIONS

Notice of Allowance dated Nov. 3, 20014 in connection with U.S. Appl. No. 13/537,452.

(Continued)

*Primary Examiner* — Kyoung Lee
(74) *Attorney, Agent, or Firm* — Eschweiler & Associates, LLC

(57) ABSTRACT

A photodetector includes a semiconductor substrate having an irradiation zone configured to generate charge carriers having opposite charge carrier types in response to an irradiation of the semiconductor substrate. The photodetector further includes an inversion zone generator configured to operate in at least two operating states to generate different inversion zones within the substrate, wherein a first inversion zone generated in a first operating state differs from a second inversion zone generated in a second operating state, and wherein the first inversion zone and the second inversion zone have different extensions in the semiconductor substrate. A corresponding method for manufacturing a photodetector and a method for determining a spectral characteristic of an irradiation are also described.

20 Claims, 9 Drawing Sheets

(56) References Cited

U.S. PATENT DOCUMENTS

| | | | |
|---|---|---|---|
| 2007/0102740 A1 | 5/2007 | Ellis-Monaghan et al. | |
| 2007/0131987 A1 | 6/2007 | Kim | |
| 2007/0141809 A1 | 6/2007 | Ponza et al. | |
| 2007/0152250 A1 | 7/2007 | Kim | |
| 2011/0291108 A1 | 12/2011 | Shen et al. | |
| 2011/0309462 A1 | 12/2011 | Sargent et al. | |

OTHER PUBLICATIONS

Notice of Allowance dated Jul. 24, 2014 in connection with U.S. Appl. No. 13/232,564.

U.S. Appl. No. 13/537,452, filed Jun. 29, 2012.

Tsutomu Sato, et al.; "Fabrication of Silicon-on-Nothing Structure by Substrate Engineering Using the Empty-Space-in-Silicon Formation Technique", Japanese Journal of Applied Physics, vol. 43, No. 1, 2004, p. 12-18.

Claudio Contiero, et al.; "Progress in Power ICs and MEMs, 'Analog' Technologies to Interface the Real World", STMicroelectronics, TP Groups R&D Department, Cornaredo, Milan, Italy, May 24-27, 2004, p. 1-10.

Non Final Office Action Dated Sep. 11, 2015 U.S. Appl. No. 14/641,472.

Notice of Allowance Dated Feb. 23, 2016 U.S. Appl. No. 14/641,472.

* cited by examiner

PHOTODETECTOR WITH CONTROLLABLE SPECTRAL RESPONSE

CROSS REFERENCE TO RELATED APPLICATION

This application is a Continuation patent application claiming priority to U.S. patent application Ser. No. 13/232,564 filed Sep. 14, 2011 and is hereby incorporated in its entirety.

FIELD

Some embodiments according to the invention are related to a photodetector. Some embodiments according to the invention are related to a method for manufacturing a photodetector. Some embodiments according to the invention are related to a method for determining a spectral characteristic of an irradiation.

BACKGROUND

In the context of what is disclosed in this document, a photodetector is a device capable of converting electromagnetic irradiation into an electrical quantity, such as voltage, current, resistance, etc. Typically, a wavelength of the electromagnetic irradiation is within a range that is visible to the human eye or adjacent to the visible wavelength range, such as infrared light or ultraviolet light. Nevertheless, it is also possible that a specific photodetector is configured to detect electromagnetic radiation in another wavelength range.

A single photodetector may be used for providing a single electrical signal indicating e.g. a brightness or intensity of an incident radiation. Another possible application of a photodetector is within image sensors, where a plurality of photodetectors are arranged in an array. Typically, a photodetector is responsive to a fixed or predetermined range of the wavelength.

SUMMARY

A photodetector according to at least some embodiments of the teachings disclosed herein comprises a semiconductor substrate having an irradiation zone configured to generate charge carriers having opposite charge carrier types in response to an irradiation of the semiconductor substrate. The photodetector further comprises an inversion zone generator configured to operate in at least two operating states to generate different inversion zones within the substrate. A first inversion zone generated in a first operating state differs from a second inversion zone generated in a second operating state. The first inversion zone and the second inversion zone have different extensions in the semiconductor substrate.

Another embodiment according to the teachings disclosed herein provides a photodetector comprising a semiconductor substrate and an inversion zone generator. The semiconductor substrate has an irradiation zone configured to generate pairs of charge carriers having opposite charge carrier types in response to an irradiation of the semiconductor substrate. The inversion zone generator is configured to operate in a plurality of different operating states to generate a plurality of different inversion zones within the semiconductor substrate, wherein the different extensions of the different inversion zones are continuously tunable in the semiconductor substrate.

Another embodiment according to the teachings disclosed herein provides a method for manufacturing a photodetector. The method comprises: providing a semiconductor substrate and forming an inversion zone generator. The semiconductor substrate has an irradiation zone configured to generate charge carriers of opposite charge carrier types in the irradiation zone in response to an irradiation of the semiconductor substrate. The inversion zone generator is configured to operate in at least two operating states to generate an inversion zone within the semiconductor substrate. A first inversion zone generated in a first operating state differs from a second inversion zone generated in a second operating state. The first inversion zone and the second inversion zone have different extensions in the semiconductor substrate.

Another embodiment according to the teachings disclosed herein provides a method for determining a spectral characteristic of an irradiation in an irradiation zone of a semiconductor substrate. The method comprises generating a first inversion zone in the semiconductor substrate having a first extension in the semiconductor substrate, wherein a first portion of the photogenerated charge carriers of a first charge carrier type is selectively conducted via the first inversion zone to a contact zone for providing a first photosignal. The method further comprises generating a second inversion zone in the semiconductor substrate having a second extension in the semiconductor substrate, wherein a second portion of the photogenerated charge carriers of the first charge carrier type are selectively conducted via the second inversion zone to the contact zone for providing a second photosignal. The first and second photosignals are then evaluated to achieve an information of the spectral characteristic of the irradiation in the irradiation zone of the semiconductor substrate.

BRIEF DESCRIPTION OF THE DRAWINGS

Embodiments according to the teachings disclosed herein will subsequently be described with reference to the enclosed figures, in which.

Equal or equivalent elements or element with equal or equivalent functionality are denoted in the following description by equal reference numerals or similar reference numerals.

DETAILED DESCRIPTION

Figure 1:
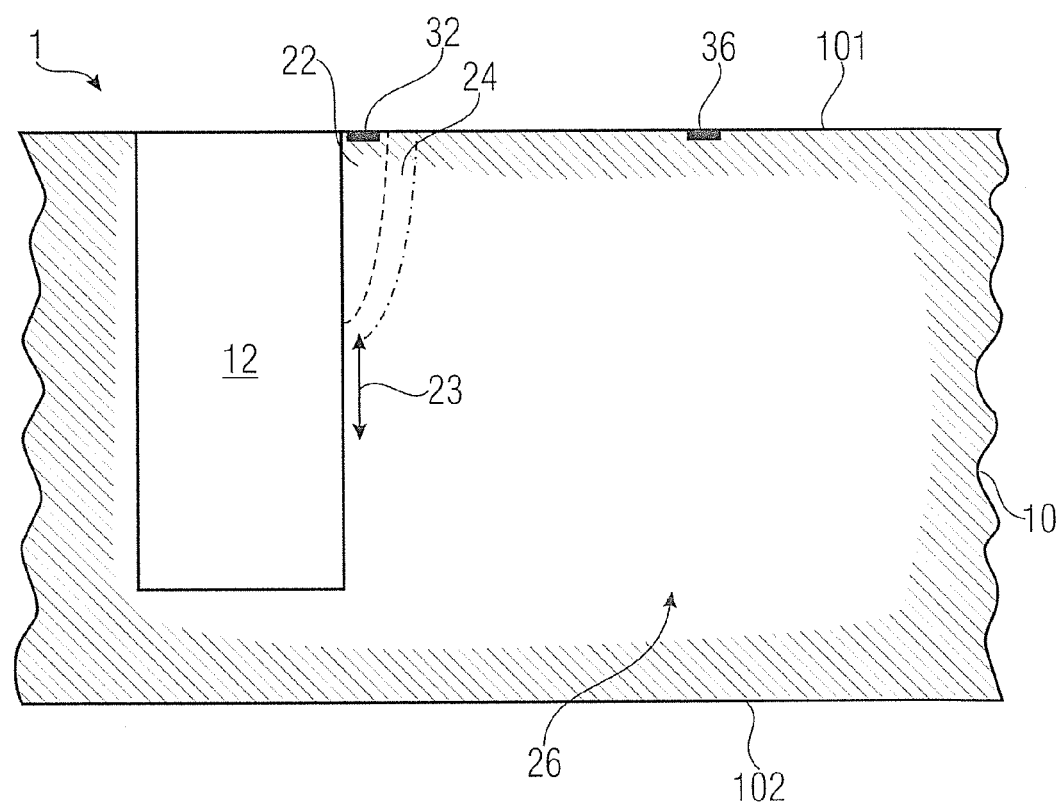
FIG. 1 shows a schematic cross section of a photodetector according to the teachings disclosed herein.

In the following description, a plurality of details are set forth to provide a more thorough explanation of embodiments of the present invention. However, it will be apparent to one skilled in the art, that embodiments of the present invention may be practiced without these specific details. In other instances, well-known structures and devices are shown in schematic cross-sectional views or top-views rather than in detail in order to avoid obscuring embodiments of the present invention. In addition, features of the different embodiments described hereinafter, may be combined with other features with other embodiments, unless specifically noted otherwise.

One of many possible applications of photodetectors is measuring a spectral characteristic, e.g., a brightness and/or a spectral composition of an incident irradiation (e.g., light). For many devices having an optical user interface (a display, a screen, a monitor, etc.) an adjustment of the brightness or of another spectral parameter of the display panel based on the ambient light is desired. Examples of these devices comprise mobile phones, smart phones, digital still cameras, notebook computers, and computer monitors. Manufacturers of these devices typically employ a system comprising a photo receiver and an application specific integrated circuit (ASIC) for adjusting the brightness. To this end it is desirable that the photodetector has a spectral sensitivity similar to a spectral sensitivity of the human eye or that the photodetector provides an output signal having a spectral information on the incident irradiation that can be evaluated with respect to the spectral sensitivity of the human eye.

Hitherto, for the above described purpose, on the one hand, components have been used employing a photodiode separated from the ASIC—the same may then be made of a different semiconductor material than from silicon. Alternatively, integrated systems are offered where the photodiode is provided on the ASIC chip. On the one hand, the latter solution has the advantage of a reduction of size of the overall system. On the other hand the photodiode depends on a minimum size that depends on the amplification performance of the downstream circuit as the photocurrent is proportional to the diode area.

From this, a drawback results. With a successive miniaturization of the circuit the relative portion of the photodiode area is strongly increased. The chip area, due to increasing production costs per unit, should, however, mainly be used for devices which are scalable.

A further drawback is the electronic characteristic of the silicon material—being a semiconductor with a bandgap of approximately 1.1 eV, the infrared portion is strongly overrated with a volume photodiode. Either cost-intensive spectral filters need to be applied above the photodiode, or signal differences between surfaceactive and volume-active photodiodes need to be evaluated. An increased effort regarding integration is associated with the latter variant.

With some optoelectronic devices, the optically generated charge carriers are guided to the contact in an inversion zone. An example for this technique are CCD structures (charge coupled devices). In a CCD an external electrode separated from the semiconductor by a dielectric induces an inversion zone. By suitable stringing together of a plurality of these structures, charge is then be passed on sequentially from one basic CCD structure to an adjacent basic CCD structure.

In some applications of optoelectronics it may be desired not to implement the transport of charge discretely but to guarantee a continuous passing on. This applies both to horizontal applications (CCD) and also to vertical devices (stacked photodiodes for evaluating the color components).

In the following, the functional principle of a MIS (metal-insulator-semiconductor) photo cell is explained. To this end, let us first consider a simple arrangement of a photo cell that comprises a semiconductor having two differently doped regions, an n-doped region and a p-doped region. In the boundary region between both regions a depletion zone (or space charge zone) is formed in which stationary, charged dopant atoms represent the vast majority of electric charges. In the p-doped boundary region of, for example, a silicon semiconductor, negatively charged acceptors (for example, boron atoms) are present. In the adjacent n-region positively charged donors (e.g., phosphor atoms) are located. These charges cause an electric field that acts upon mobile charges (negative electrons and positive holes).

An electron/hole pair generated by light may be separated by such an electric field. A precondition for this is, however, that the charge carriers are either generated in the depletion zone (space charge zone) or may reach the same by diffusion, when a suitable concentration gradient of the charge carriers exists and the pair of particles is not destroyed again before reaching the depletion zone (recombination). From this, a photo voltage results that may lead to an exterior current flow when said regions are suitably contacted.

Equivalently, instead of an n-doped region, an inversion zone may be used. Here, by a suitable external potential (e.g., caused by a conductive plate insulated by an insulator, e.g. an oxide, from the semiconductor) the surface charge carrier concentration can be changed so that the electron concentration is higher than the hole concentration deep within the volume of the semiconductor. Thus, a depletion zone between the inversion zone and the deep volume is formed which is able to separate charge carrier pairs.

The photo current is thus a result of the cooperation of local fields (e.g., in depletion zones) and concentration gradients of mobile charges. The concentration gradients are defined by spatially varying generation and recombination processes and by transport processes.

The following example is presented to illustrate the cooperation between the local fields and the concentration gradients of mobile charges. At the surfaces of the semiconductor, unsaturated bindings (bonds) are present that cause an increased recombination of electrons and holes. In case of a charge carrier concentration that is above the equilibrium concentration, for example due to photo generation, mobile electrons and mobile holes are destroyed (i.e., they recombine) at the surfaces of the semiconductor. Hence, a concentration gradient is formed that causes charge carriers to diffuse from the interior of the semiconductor to the surface(s), so that these mobile charge carriers also recombine at the surface defects/impurities. These charge carriers subject to recombination at the surface(s) thus do not contribute to the photo current. Thus, also the depletion zone in the internal volume of the semiconductor, at the pn junction (or at the inversion zone in case of the MIS structure), creates a charge carrier drain for the minority charge carriers (in the p-semiconductor these are the electrons, in the n-semiconductor the holes), as the described field extracts the same into the opposing region (or into the inversion zone). These charge carriers may contribute to the photocurrent when collected in an suitable manner.

To be more specific, in case the charge carriers are transported via the inversion zone to an external contact and, then, to an external circuitry as a photocurrent, a charge carrier concentration at, or near, the equilibrium concentration is maintained in the material of the semiconductor substrate adjacent (at the border) to the depletion zone/inversion zone even during a photo generation of charge carriers in the semiconductor substrate. Thus, in response to a photo generation of charge carriers in the irradiation zone, a charge carrier concentration gradient is formed in the irradiation zone in a direction to the depletion zone (and the inversion zone adjacent thereto). This charge carrier concentration gradient effects a minority charge carrier diffusion to the depletion zone/inversion zone. Therefore the depletion zone acts as a charge carrier drain for the minority charge carriers photo generated in the irradiation zone.

The described processes are, in case of a photo generation (generation of electron/hole pairs by light), overlaid by a spatially varying generation process. On the one hand, a light beam that generates the same number of charge carrier pairs per wavelength unit, causes an exponentially decaying irradiation strength in the semiconductor (evanescent light field). On the other hand, the absorption (generation) is dependent on the wavelength—blue light is absorbed substantially faster in silicon than red or infrared light. Thus, only by the irradiation of the semiconductor, a locally varying concentration of charge carriers is caused. In particular the dependence of the absorption on the wavelength of the light may be used to enable a spectral evaluation of the light by an advantageous spatial setup of the photo detector. This possibility was utilized in the device that is described in the following.

FIG. 1 shows a schematic cross section of a photodetector 1 according to the teachings disclosed herein. The photodetector comprises a semiconductor substrate 10 having a first main surface 101 and a second main surface 102. Incident irradiation such as visible light, ultraviolet light, infrared light, or another type of radiation may enter an irradiation zone 26 within the semiconductor substrate 10. Thus, at least a part of the semiconductor material or the entire semiconductor material of the semiconductor substrate 10 may form the irradiation zone 26. Within the irradiation zone, charge carriers having opposite charge carrier types (e.g., negatively charged electrons and positively charged holes) may be generated in response to the irradiation of the semiconductor substrate 10. The irradiation zone 26 is typically defined by its above mentioned function and may extend within a portion of the semiconductor substrate 10 or within the entire semiconductor substrate 10.

The photodetector 1 shown in FIG. 1 further comprises an inversion zone generator 12. The inversion zone generator 12 is configured to generate an inversion zone 22 within the semiconductor substrate 10, wherein a depletion zone 24 is generated together with the inversion zone 22 by the inversion zone generator 12. The depletion zone 24 typically has a larger extension within the semiconductor substrate 10 than the inversion zone 22. As explained above, the inversion zone may be generated by a suitable external potential, e.g., caused by an electric conductor that is part of the inversion zone generator 12 and that is insulated from the semiconductor 10. Accordingly, the surface charge carrier concentration at the interface between the inversion zone generator 12 and the substrate 10 is changed so that, in the case of a p-doped semiconductor substrate 10, the electron concentration close to the inversion zone generator is higher than the hole concentration deep within the volume of the semiconductor 10.

The inversion zone generator 12 is configured to operate in a first operating state and in a second operating state. The first operating state and the second operating state differ with respect to the extension of the inversion zone 22 generated by the inversion zone generator 12 within the substrate 10 (or relative to the substrate 10), in particular into the irradiation zone 26 or with respect to the irradiation zone. FIG. 1 illustrates the photodetector while being in the first operating state. In the first operating state the inversion zone 22 extends approximately to half the depth of the inversion zone generator 12. In the second operating state (not shown) the inversion zone 22 may extend to approximately the full depth of the inversion zone generator 12. The (discrete or continuous) adjustability or variation of the extension of the inversion zone 22 is indicated in FIG. 1 by an arrow 23. Besides a variation of the depth extension of the inversion zone 22 into the substrate, it may also be possible to vary, e.g., a position of the inversion zone 22 or a lateral extension of the inversion zone 22 within the substrate.

The photodetector 1 shown in FIG. 1 further comprises a contact zone 32 and a substrate contact (or substrate contact zone) 36. The contact zone 32 is configured to provide the photogenerated charge carriers of a first charge carrier type (typically the minority charge carriers) to an external circuitry, e.g. to a subsequent evaluation circuitry (not shown). In the embodiment shown in FIG. 1, the contact zone 32 is located at the first main surface 101 of the substrate 10 in the vicinity of the inversion zone generator 12. The charge carriers of the first charge carrier type are conducted along the inversion zone 22 from the depth of the semiconductor substrate 10 to the first main surface 101 where they may be provided to the subsequent evaluation circuitry via the contact zone 32. Due to the extraction of charge carriers via the inversion zone 22 and the contact zone 32, a corresponding number of charge carriers of the opposite type do not find recombination partners. These charge carriers of the opposite type may be provided to the evaluation circuit via the substrate contact 36.

In the following, a number of possible configurations and implementations of the photodetector 1 are discussed.

The inversion zone generator 12 may be configured to generate a first depletion zone 24 for separating two conjointly photogenerated charge carriers of opposite charge carrier types. The first depletion zone 24 is adjacent to, or directly in contact with, the first inversion zone 22. The inversion zone generator 12 may also be configured to generate a second depletion zone for separating two conjointly photogenerated charge carriers of opposite charge carrier types, the second depletion zone being adjacent to the second inversion zone.

A charge carrier concentration gradient may be formed in the irradiation zone 26 in response to a photogeneration of the charge carriers in the irradiation zone 26. The charge carrier concentration gradient may be formed in a direction to (or towards) the first inversion zone 22 and a first depletion zone 24 adjacent thereto in the first operating state, and in direction to (or towards) the second inversion zone and a second depletion zone adjacent thereto in the second operating state. This formation of the charge carrier concentration gradients is also applicable to further operating states in which further inversion zones are generated that have different extensions into, or with respect to, the irradiation zone.

The photodetector 1 may further comprise a contact zone 32 configured to provide the photogenerated charge carriers of a first charge carrier type. In the first operating state, the first inversion zone 22 is configured to selectively collect a first portion of the photogenerated charge carriers of the first charge carrier type and to conduct the collected first portion of the photogenerated charge carriers to the contact zone 32. In the second operating state, the second inversion zone is configured to selectively collect a second portion of the photogenerated charge carriers of the first charge carrier type and to conduct the collected second portion of the photogenerated charge carriers to the contact zone 32.

The inversion zone generator 12 may comprise an electrode arrangement configured to create an electrical field within the semiconductor substrate 10 in order to generate the inversion zone 22. The inversion zone generator 12 may further comprise an insulator arrangement configured to insulate the electrode arrangement against the semiconductor substrate 10.

The electrode arrangement and the insulator arrangement may be arranged in a plurality of trenches, at least one trench of the plurality of trenches having a different depth than at least one other trench of the plurality of trenches. At least one electrode of the electrode arrangement may be arranged in a trench of the plurality of trenches having a first depth and at least one other electrode of the electrode arrangement may be arranged in a trench of the plurality of trenches having a second depth different from the first depth. The at least one electrode and the at least one other electrode are controllable independently from each other so that the electrode arrangement is configured to selectively form the first inversion zone 22 at the trench having the first depth or at the trench having the second depth, depending on a control signal applied to the electrode arrangement.

An electrode in at least one trench may be connected to the semiconductor substrate 10 at a bottom of the trench to provide a contact.

The electrode arrangement and the insulator arrangement may extend along a direction substantially orthogonal to a main surface (e.g., first main surface 101 or second main surface 102) of the semiconductor substrate 10. At least one of the following properties may vary along the direction substantially orthogonal to the main surface of the semiconductor substrate 10:

a thickness of the insulator arrangement; and
a dielectricity of the insulator arrangement.

The insulator arrangement may comprises a liner oxide. The electrode arrangement may comprise a poly-silicon electrode material. The semiconductor substrate 10 in the irradiation zone 26 may comprise a single doping type semiconductor material.

The electrode arrangement and the insulator arrangement may extend along a direction substantially orthogonal to a main surface 101, 102 of the semiconductor substrate 10. A doping concentration of the single doping type material may vary along the direction substantially orthogonal to the main surface 101, 102 of the semiconductor substrate 10.

The single doping type material may extend from the inversion zone generator 12 for at least a tenth of a diffusion length (i.e., 10% of the diffusion length) of a first charge carrier type within the single doping type material. Larger extensions of the single doping type material may be considered as well, such as at least 20%, at least 30%, at least 50%, at least 80%, or at least 100% the diffusion length.

The inversion zone generator 12 may have a main interface with the semiconductor substrate 10. At least one of the following properties may vary in a direction parallel to the interface:

a dielectricity of an insulating arrangement between the inversion zone generator 12 and the semiconductor substrate 10; and
a thickness of the insulating arrangement between the inversion zone generator 12 and the semiconductor substrate 10.

The semiconductor substrate 10 in the irradiation zone 26 may comprise a single doping type semiconductor material. The inversion zone generator 12 may have a main interface with the semiconductor substrate 10 and a doping concentration of the single doping type material may vary in a direction parallel to the interface. The doping concentration may vary in a continuous manner or in a substantially stepwise or stair-like manner.

The irradiation zone 26 possibly does not comprise a pn-junction.

The inversion zone generator 12 may be arranged in at least one trench formed in the semiconductor substrate 10.

The photodetector 1 may further comprise an inversion zone controller (not shown) configured to provide a control signal to the inversion zone generator 12 for controlling at least one of a shape and a location of the inversion zone 22.

The semiconductor substrate 10 may be configured to receive the irradiation from a backside, i.e., the second main surface 102, of the substrate 10.

The photodetector 1 may further comprise an evaluation circuit (not shown) configured to evaluate the photogenerated charge carriers obtained from the first inversion zone 22 and the second inversion zone. The photodetector may further comprise a substrate contact 36 connected to the evaluation circuit and configured to contact a region of the semiconductor substrate 10 to which the first inversion zone 22 and the second inversion zone do not extend. Moreover, the photodetector 1 may comprise a contact zone 32 connected to the evaluation circuit and configured to provide the photogenerated charge carriers to the evaluation circuit. In the first operating state the first inversion zone 22 is configured to conduct the photogenerated charge carriers from the irradiation zone 26 (or a first portion thereof) to the contact zone 32. In the second operating state the second inversion zone is configured to conduct the photogenerated charge carriers from the irradiation zone 26 (or a second portion thereof) to the contact zone 32.

The inversion zone generator 12 may be configured to operate in a plurality of different operating states to generate a plurality of different inversion zones within the semiconductor substrate. The different extensions of the different inversion zones may be continuously tunable with respect to the irradiation zone of the semiconductor substrate.

Figure 2:
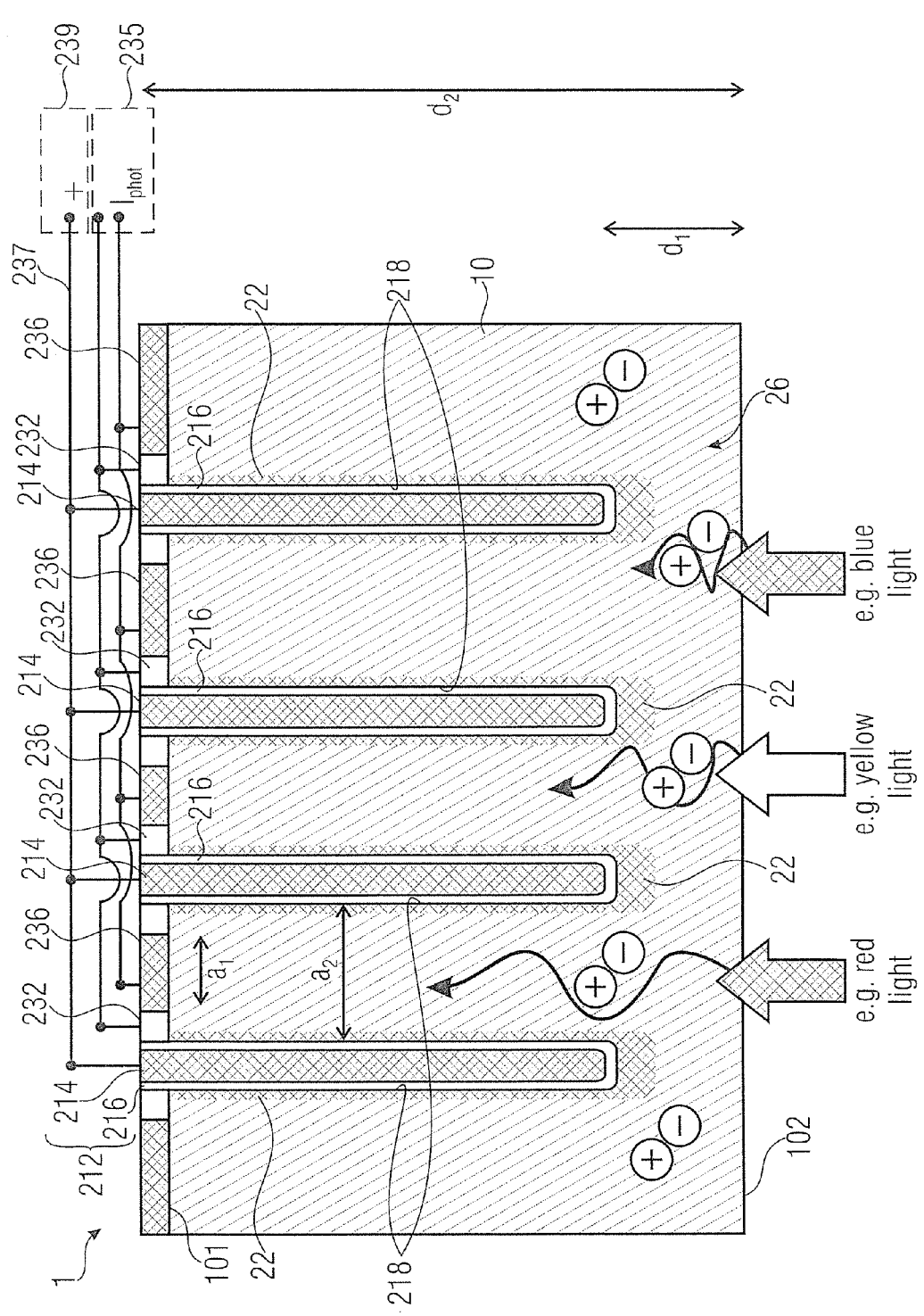
FIG. 2 shows a schematic cross section of a photodetector according to another embodiment of the teachings disclosed herein.

In FIG. 2, a device is illustrated that, for example, comprises an n-doped semiconductor or a p-doped semiconductor, i.e. the semiconductor substrate 10. FIG. 2 shows a schematic cross section of an MIS structure for evaluating a radiation from the chip back side 102 (irradiation from the front side 101 is also possible). Within the semiconductor substrate 10, so called deep trenches 218 are located wherein the deep trenches 218 are provided with a thin dielectric 216 at the side faces and at the bottom. Within the trenches 218, the cavities left by the thin dielectric 216 are filled with a conductive electrode material 214. The thin dielectric 216 and the conductive electrode material 214 are part of the inversion zone generator 212. When a suitable potential is applied to the electrode 214, an inversion zone 22 is formed (typically some nm wide) in the adjacent region of the semiconductor region. This arrangement is then able to separate electron/hole pairs which were generated by incident light as exemplarily described above with respect to the MIS structure. Now, the charge carriers may superficially (i.e., at the first main surface 101 of the semiconductor substrate 10) contribute to an exterior photo current by contacting.

In the illustrated example of FIG. 2, the semiconductor substrate 10 is a p-doped semiconductor. In order to conduct charge carriers from the inversion zone 22 to the outside, in the (immediately) surrounding of the trenches 218 a contact is set to a local n-region 232 in order to act as the contact zone mentioned above. Likewise, a substrate contact is set to a local p-region 236. The n-region 232 may be an n-SD-implant and the p-region 236 may be a p-SD-implant. Now, two cases of operation are possible. When the inversion zone 22 is switched on, charge carriers from the depth of the semiconductor may contribute to the photo current which would not have reached the superficial pn-junction between the p-doped substrate 10 and the contact zone 232 without an existing inversion zone (due to previous recombination). When the inversion zone 22 is switched off, only charge carriers are collected which reach the pn-junction between the substrate 10 and the contact zone 232 by diffusion and are not destroyed before by recombination.

More generally, the inversion zone generator 212 comprises an electrode arrangement 214 configured to create an electrical field within the semiconductor substrate 10 in order to generate the inversion zone 22. The inversion zone generator 212 further comprises an insulator arrangement 216 configured to insulate the electrode arrangement 214 against the semiconductor substrate 10. The electrode arrangement 214 is connected to a conductor 237 configured to apply a desired electrical potential to the electrode arrangement 214. The electrical potential serves as a control signal for the electrode arrangement 214 and may be provided by an inversion zone controller 239. The photodetector 1 may further comprise or be connectable to an evaluation circuit 235 which is configured to receive the photocurrent $I_{phot}$ from the n-region 232 acting as the contact zone and from the p-region 236 acting as the substrate contact.

If the device shown in FIG. 2 is illuminated from the front side 101, when the inversion zone 22 is switched on, the spectral sensitivity in the red and infrared range is improved, as light of these wavelengths generates charge carrier pairs deep within the silicon, which may now be extracted.

With an illumination from the backside 102 (as illustrated for irradiations of three different wavelengths), inverse conditions apply. The inversion zone 22 then causes light of shorter wavelengths (e.g., blue light) to be able to contribute better to the photo current, as the charge carriers generated close to the backside 102 may be extracted or sucked off more efficiently.

The dimensions of the photodetector may be chosen as follows for informative and by no means limiting purposes, only. The p-region 236 serving as the substrate contact may have a width $a_1$ which is in a range from 40 µm to 160 µm with a typical value being 80 µm. A gap between two trenches 218 has a width $a_2$ which may range from about 50 µm to about 200 µm. A typical value for $a_2$ may be 100 µm. The semiconductor substrate 10 has a thickness $d_2$ which may be in a range from 40 µm to 500 µm, for example 225 µm. A distance between the second main surface 102 of the semiconductor substrate 10 and a lower end of the inversion zone generator 12 is indicated in FIG. 2 by $d_1$ which may be comprised in a range from 1 µm to 10 µm, for example 2 µm, 5 µm, or 8 µm, as well as values in between.

From the basic functional principle of the structure shown in FIG. 2 described above, further variants of the device may be derived, which will be described below. Trench electrodes of different depths which may be switched separately enable a discrete spectral response which is varied with each trench depth. By a differential formation of the signals with a respectively switched on inversion zone, thus a spectral evaluation of the incoming light is possible. A more elegant variant to achieve a continuous evaluation of the light spectrum is achieved when the threshold voltage of the inversion zone varies along a trench into the depth. Then, the formation of the inversion zone with smaller voltages is only given in the upper region of the trench electrode and migrates into the depth with increasing voltages. Such an arrangement may, for example, be acquired when the dopant concentration is increased into the depth or the dielectric is implemented conically.

Apart from the possibility of being used as a spectrometer, the device has the advantage that with a minimum space requirement on the front side 101, an irradiation from the backside 102 may be evaluated. Thus there is enough space for the evaluation circuit 235 between the trench electrodes in the surrounding region. The space requirement of the irradiated zone is then substantially decoupled from the area used on the front side. This advantage is achieved without patterning or structuring processes being required on the backside 102 of the device.

Figure 3:
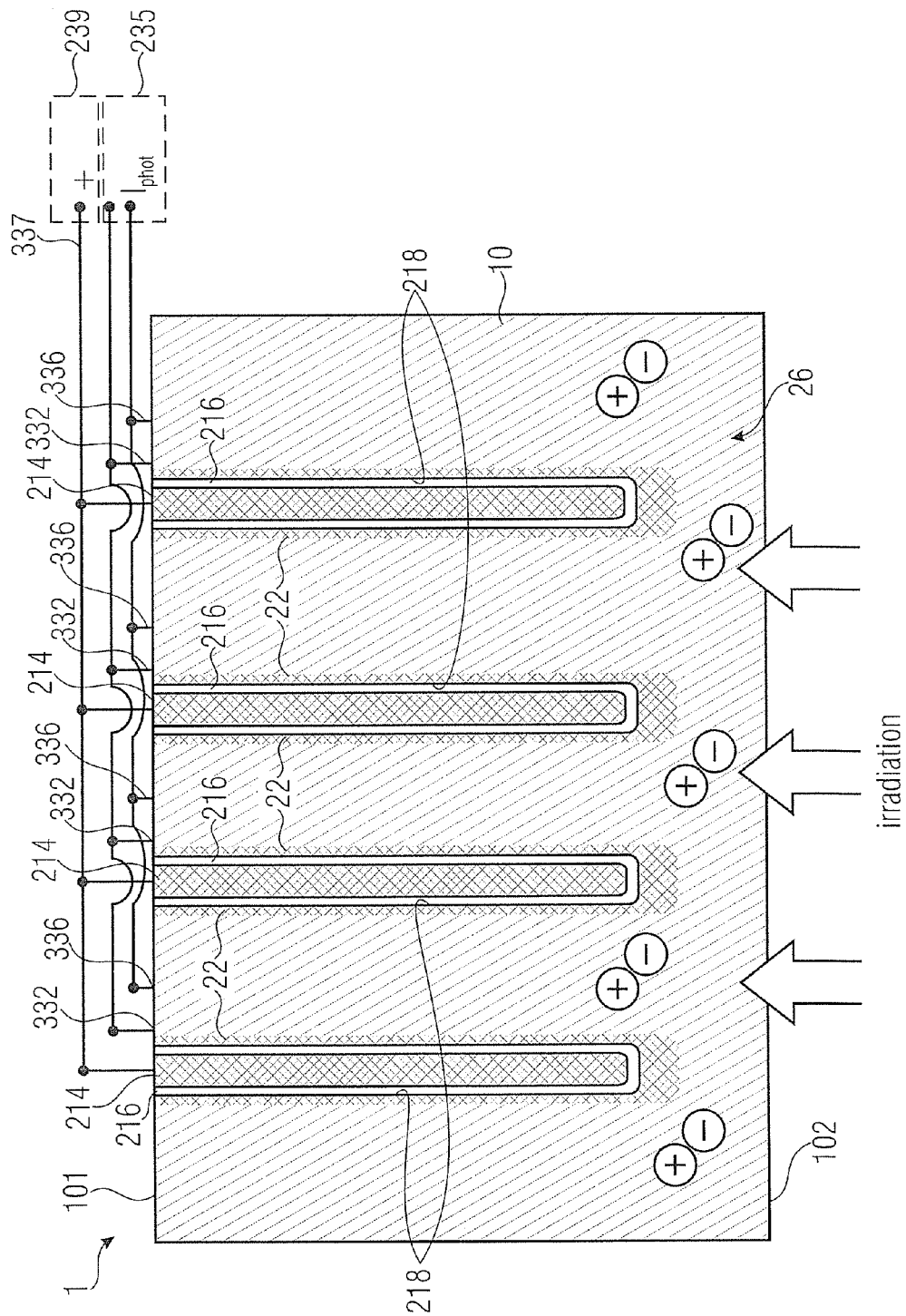
FIG. 3 shows a schematic cross section of a photodetector according to a further embodiment of the teachings disclosed herein.

FIG. 3 shows a schematic diagram of the MIS structure for the evaluation of the irradiation from the backside 102 of the chip. The photodetector shown in FIG. 3 is similar to the photodetector shown in FIG. 2. The embodiments shown in FIGS. 2 and 3 differ with respect to contact zones 232 and 332 and also with respect to the substrate contacts 236 and 336.

According to at least some embodiments of the teachings disclosed herein, a (deep) trench 218 (or a plurality of trenches 218) is (are) structured from the chip front side 101. The trench 218 is lined with a liner oxide 216 and filled with an electrode material (e.g. polysilicon) 214. Together with the surrounding substrate material 10 this trench 218 represents an MIS structure. The electrode arrangement 214 is connected to the inversion zone controller 239 via a conductor 337 in order to receive a control signal from the inversion zone generator. In the operating state illustrated in FIG. 3 a positive electrical potential relative to an electrical potential of the semiconductor substrate 10 is applied to the electrode arrangement 214, as indicated by the plus sign at the conductor 337. This causes the electrons in the p-doped semiconductor substrate 10 to form inversion zones 22 around the trenches 218.

The contact zone 332 of the photodetector shown in FIG. 3 comprises a direct contact to the semiconductor substrate 10 in the vicinity of the insulator arrangement 216, so that the minority charge carriers conducted along the inversion zone 22 can be provided via the contact zone 332 to subsequent evaluation circuitry 235. Likewise, the substrate contact 336 is a direct contact to the semiconductor substrate 10 which may be located relatively far away from the trench 218 or the trenches 218. In the embodiment shown in FIG. 3, the substrate contact 336 is approximately halfway between two neighboring trenches 218, but could be located at another location, as well. For example, the substrate contact 336 may be located at a distance between a few micrometers and some hundred micrometers in lateral direction from the trenches.

The illustrated basic structure enables ample variations and modifications. For example, the p-contact 336 may also be buried by a trench into the substrate 10.

Figure 4A:
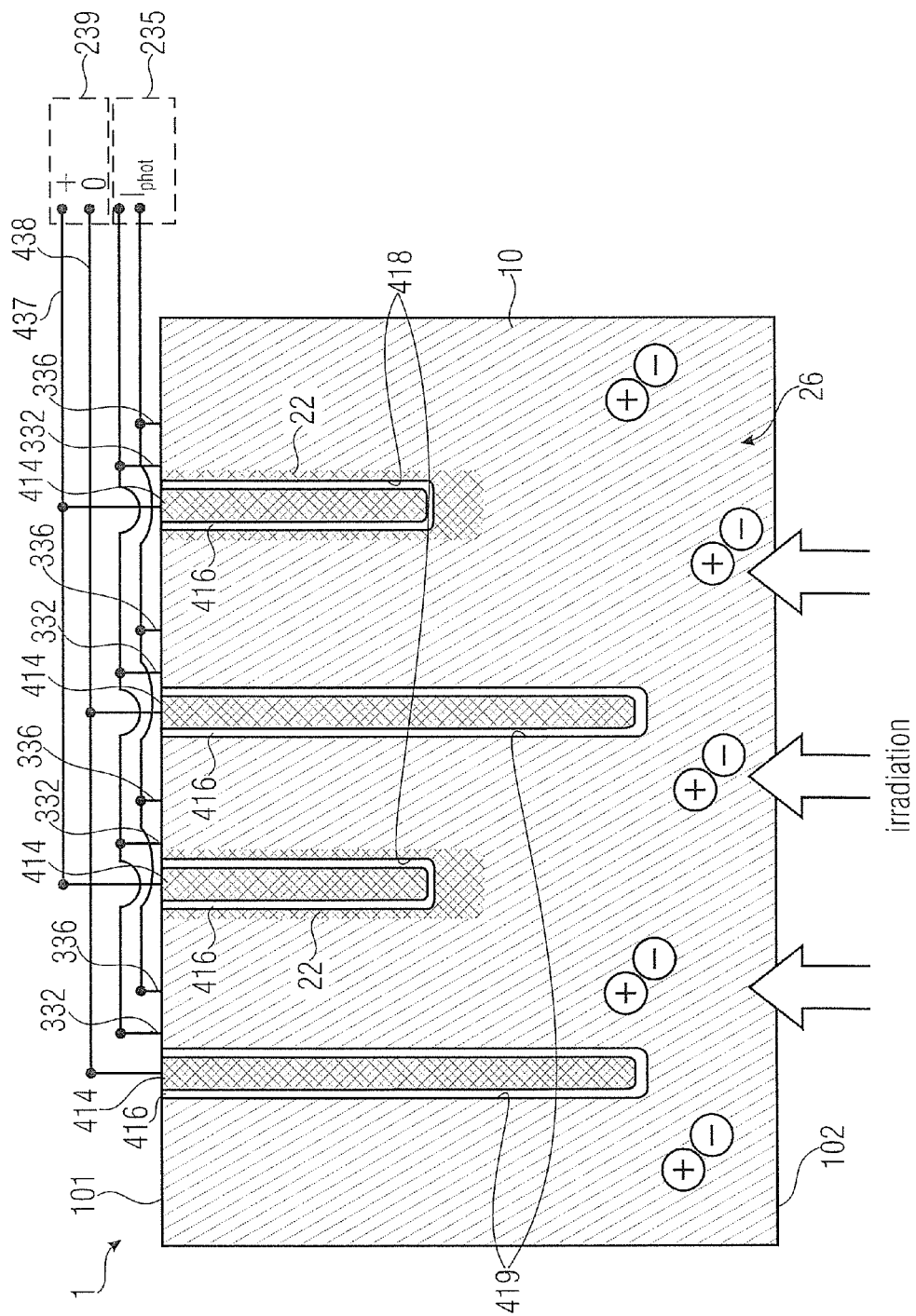
FIG. 4A shows a schematic cross section of a photodetector according a further embodiment of the teachings disclosed herein in a first operating state.
Figure 4B:
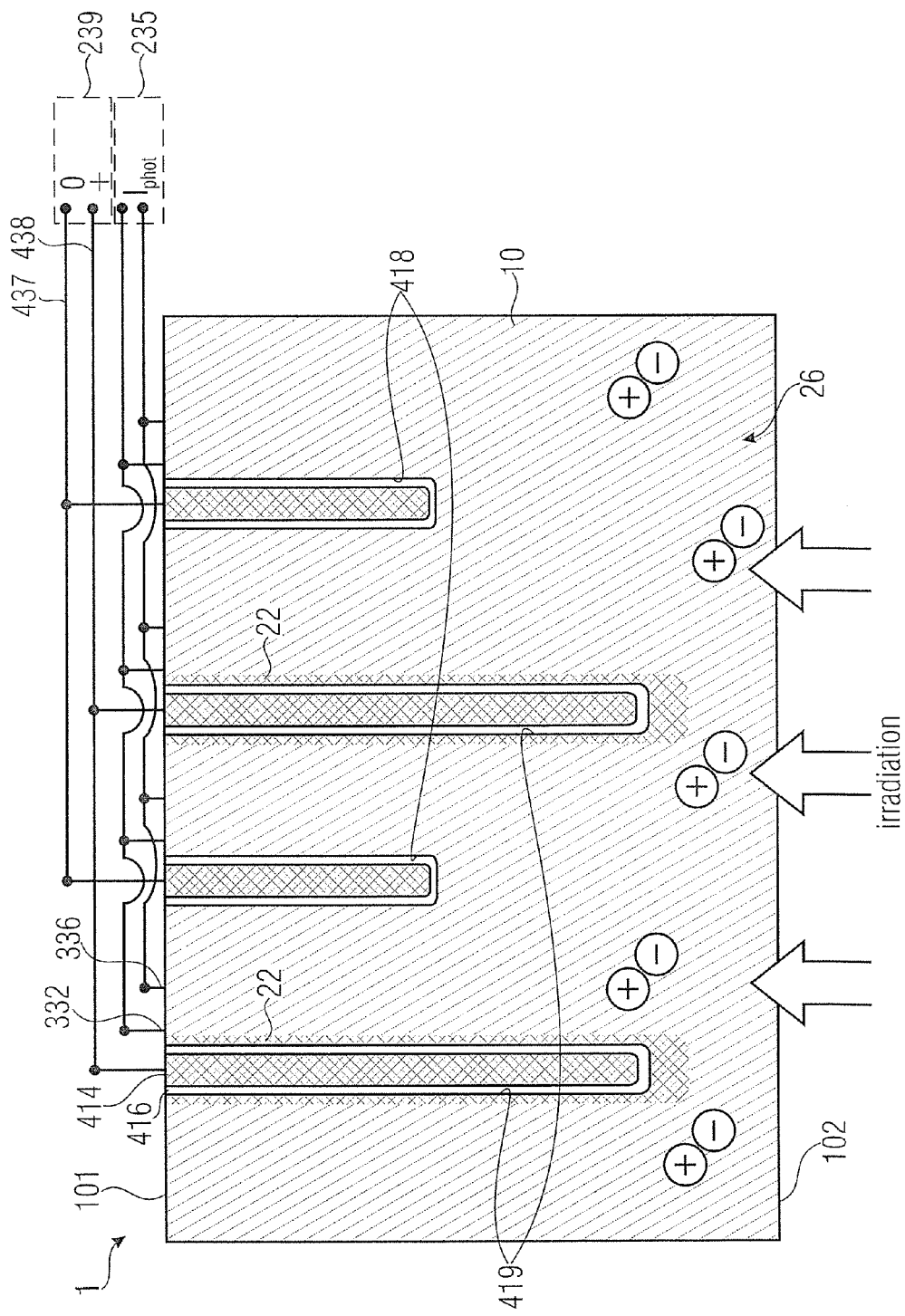
FIG. 4B shows a schematic cross section of the photodetector of FIG. 4A in a second operating state.

In order to enable a spectral evaluation, a structure with MIS trenches of different depths as illustrated in FIGS. 4A and 4B may be used. By applying a voltage for substrate inversion the illustrated structure may then scan the different substrate depths by means of the trenches (as the inversion zone generators) having different depths and thus lead to a spectral evaluation by suitable methods of differential amplification of the different photocurrents.

The photodetector comprises a first trench or first group of trenches 418 and a second trench or a second group of trenches 419. The first trench(es) 418 has/have a first depth and the second trench(es) 419 has/have a second depth into the semiconductor substrate 10 when measuring from the first main surface 101.

In FIG. 4A the photodetector is illustrated in the first operating state and only the less deep trenches 418 are active (deep trenches 419 are at a reference potential of e.g. approximately 0 V relative to the substrate 10). In this manner, strongly infrared spectral components are evaluated. FIG. 4B shows the photodetector in the second operating state. The deep trenches 419 are active, and also charge carriers close to the second main surface 102 may be evaluated (generated by light of a shorter wavelength).

In one embodiment the plotted trenches may have a diameter of approximately some hundred nanometers up to 3 µm, 5 µm, or 10 µm (e.g., 400 nm, 600 nm, 800 nm, 1 µm, 2 µm, as well as values in between these diameters) and a typical distance of 1 µm or more, 5 µm or more, 50 µm or more, possibly up to several hundred micrometers (e.g., 80 µm, 90 µm, 150 µm, or 200 µm, as well as values in between these distances). Thus the trenches 418, 419 may lie between possibly present ASIC components and occupy the chip area only to a negligible extent. The indicated values may be applicable to other embodiments according to the teachings disclosed herein, that are illustrated in other Figures or described at other places of the text, as well.

An idea of the embodiment shown in FIGS. 4A and 4B is to provide an arrangement for evaluating the spectral distribution of the ambient light by a MIS (Metal Insulator Semiconductor) cell which is able to provide charge carriers to an evaluation electronics by photons impinging onto the backside of the chip. Here, deep trenches are used that are filled with polysilicon. By applying a suitable electrical potential at the poly contact, an inversion layer 22 (or several inversion layers 22) may be generated in the direct vicinity of the trenches. The inversion layer(s) 22 then, on the one hand, serve(s) for separating electrons and holes and on the other hand serve(s) as a current channel in order to guide the charge carriers to the chip front side 101. The electrical potential applied at the poly contact is generated by the inversion zone controller 239. The inversion zone controller 239 comprises two outputs. A first one of the two outputs of the inversion zone controller 239 is connected, via an electrical connection 438, to the first trench(es) 418. A second output of the inversion zone controller is connected, via a second electrical connection 437, to the second trench(es) 419. In FIG. 4A, a positive electrical potential relative to the reference potential of the semiconductor substrate 10 is applied to the second trenches 419, while the reference potential is applied to the first trenches 418. In FIG. 4B, a positive electrical potential relative to the reference potential of the semiconductor substrate 10 is applied to the first trenches 419, while the reference potential is applied to the second trenches 418.

By employing trenches of different depths different spectral components may be evaluated during different operating states.

The concept illustrated in FIGS. 4A and 4B may be extended to further depth variations. By cascades of MIS trenches of different depths different spectral ranges may be scanned sequentially. Further, a part of the trenches may be used for a deep p-contact (with a removal of the oxide 416 at the trench bottom).

The structure shown in FIGS. 4A and 4B discretely scans different spectral components—respectively stepped by the number of trenches of different depths.

Figure 5:
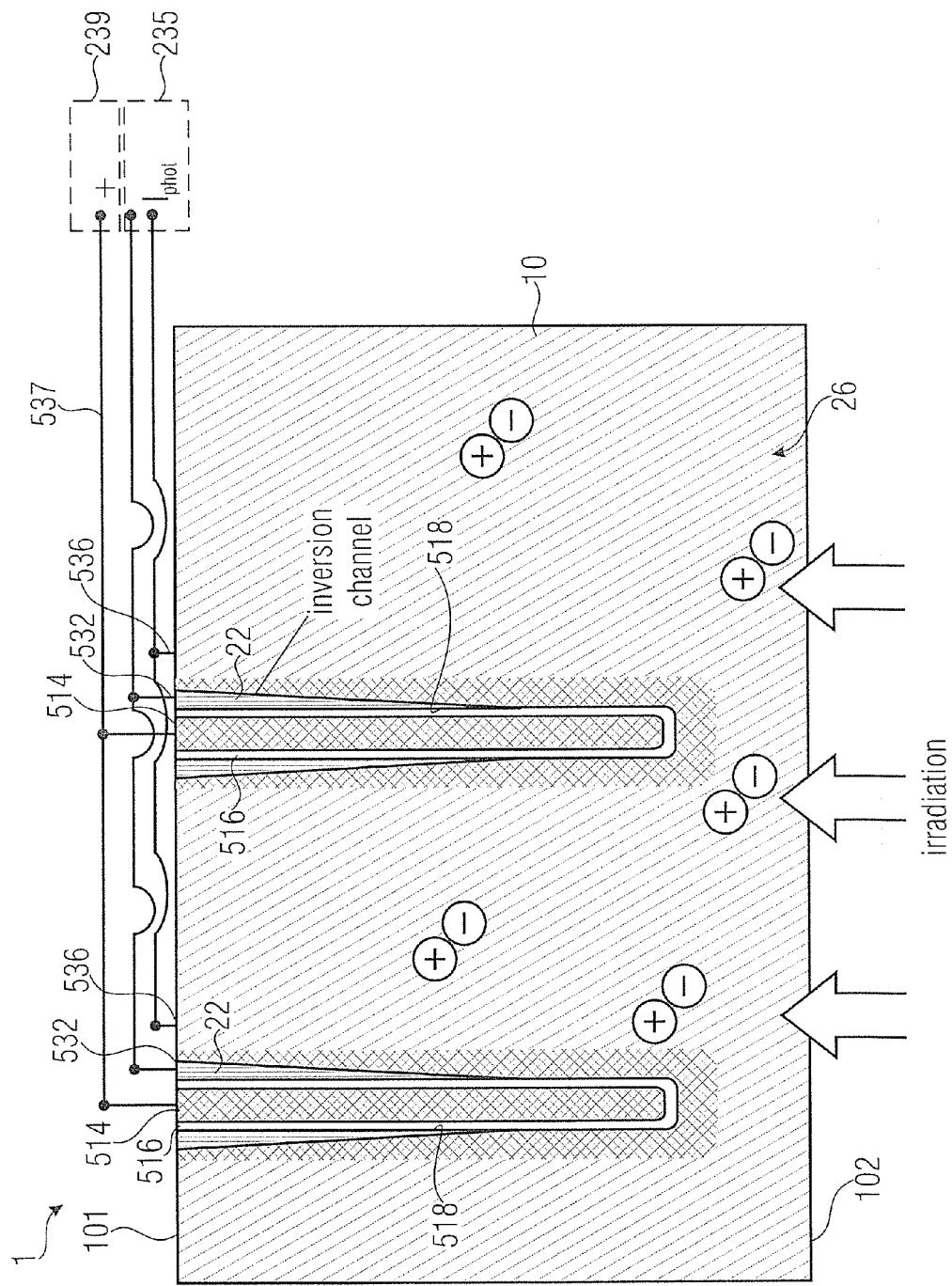
FIG. 5 shows a schematic cross section of a continuously variable photodetector according to a further embodiment of the teachings disclosed herein.

Turning now to FIG. 5, the teachings disclosed herein further provide the following configuration. The semiconductor material 10 in which, when applying a suitable electrode voltage to the electrode arrangement 514, a shift of the charge carrier concentration takes place, is not uniformly driven into the inversion. Suitable provisions in the structure or doping enable an inversion zone 22 which becomes larger with increasing voltage.

A vertical implementation of this aspect of the teachings disclosed herein comprises the form described in FIG. 2 or 3 as a basic structure.

The embodiment shown in FIG. 5 and described in the following provides for a voltage-dependent expansion of the inversion zone 22 to be formed into the depth. In particular, the inversion zone 22 (and the adjacent depletion zone 24) may be tuned, regarding its depth extension, by means of the potential at the trench contact 514.

In principle, there are several possibilities to generate an inversion zone 22 (continuously or gradually) extending into the depth (some examples):

The trench dielectric 516 becomes thicker in the trench 518 with an increasing depth. As the electric field in the dielectric 516 is constant, the surface potential at the border to the surrounding substrate silicon 10 is linearly associated with the thickness of the dielectric 516 (potentials and the like are constant).

The trench dielectric 516 changes its dielectric characteristics into the depth—e.g. by decreasing nitriding. Thus, the magnitude of the electric field in the dielectric 516 is lower at the trench bottom.

The doping in the surrounding silicon 10 increases with an increasing depth. Thus, in the depth a higher voltage is required at the trench contact 537 to be able to cause an inversion.

The consequences of the described measures are similar. With a small positive potential at the trench contact 537 only the top portion of the surrounding substrate silicon 10 is inverted. With an increasing potential the inversion zone 22 migrates into lower regions (i.e., towards the second main surface 102), as well. Thus, the extension of the inversion zone 22 is continuously/gradually adjustable. In this manner, if different extensions of the irradiation zone are successively adjusted, then different charge carrier concentration gradients to the depletion zone 24 adjacent to the inversion zone 22 occur, so that also a spectral sensitivity of the photodetector is continuously/gradually adjustable.

Depending on the extension of the inversion zone 22, charge carriers may be collected (via the contact zone 532 and the substrate contact 536) which were generated by light of different penetration depths. Assuming an irradiation from the second main surface 102 of the semiconductor substrate 10, the photodetector 1 may, for example, behave as follows. With a low positive potential at the trench contact 537, the photocell is mainly infrared-sensitive, with a higher voltage it is increasingly also sensitive for visible light.

By means of a suitable evaluation of the voltage-dependent photocurrent (or the accumulated charge), the spectral combination or the color temperature of the light may be determined.

Figure 6:
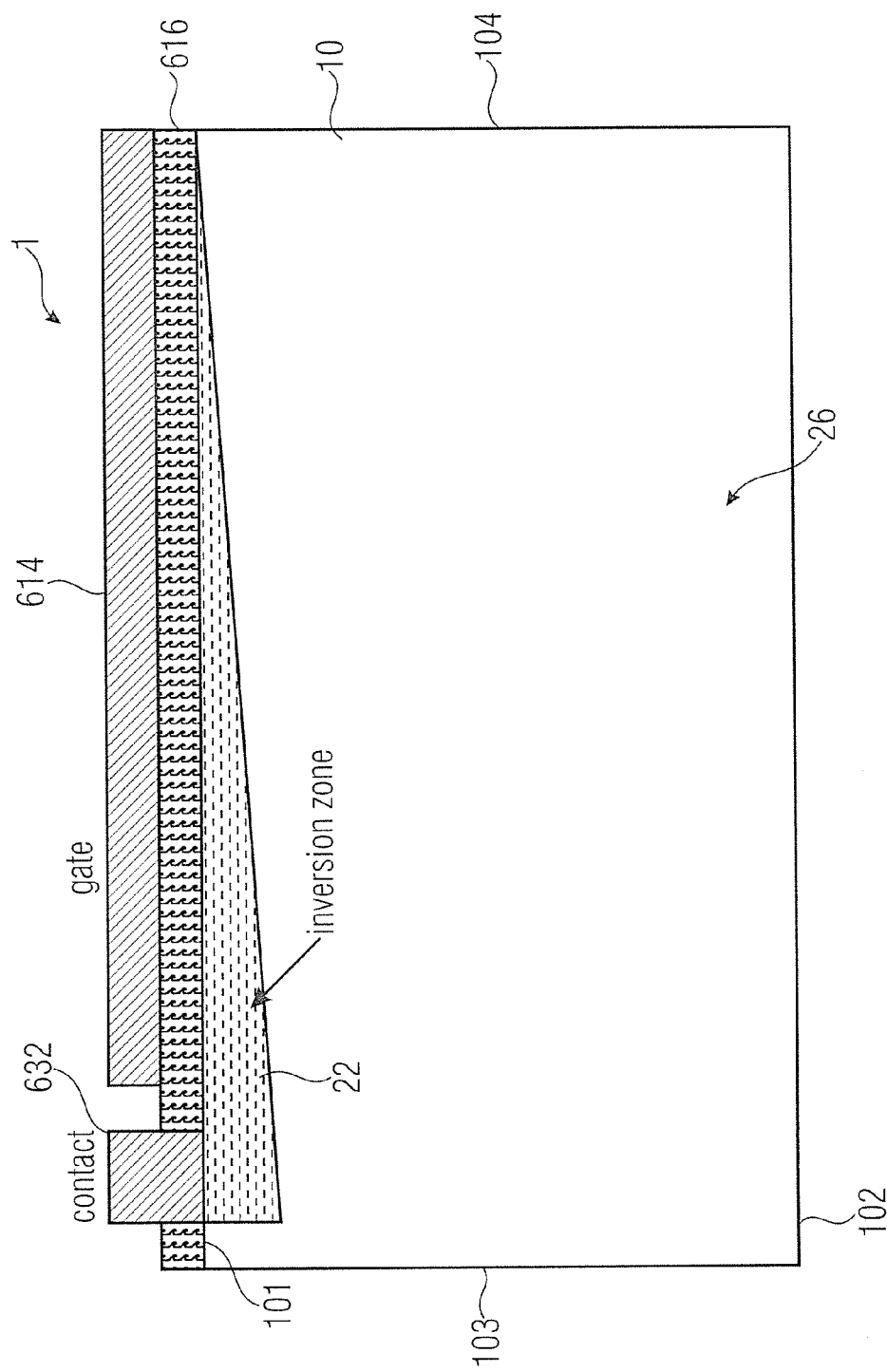
FIG. 6 shows a schematic cross section of a photodetector according to a further embodiment of the teachings disclosed herein, the photodetector having a lateral configuration.

Turning now to FIG. 6, in principle a similar configuration as the one shown in FIG. 5 may be implemented at the surface 101 of the semiconductor device. Thus, the photo-sensitivity is laterally varied.

The embodiment shown in FIG. 6 comprises the electrode arrangement 614 which functions in a similar manner as the gate of a field effect transistor. The electrode arrangement 614 is insulated against the semiconductor substrate 10 by a dielectric or insulator arrangement 616. The contact zone 632 provides an electrical connection from the first main surface 101 of the semiconductor substrate 10 to a surface of the insulator arrangement 616. When a suitable electrical potential is applied to the electrode arrangement 614 (positive electrical potential relative to the semiconductor substrate 10 in the case of a p-doped semiconductor substrate 10; negative electrical potential relative to the semiconductor substrate 10 in the case of an n-doped semiconductor substrate 10), the minority charge carriers in the semiconductor substrate 10 gather at the interface between the semiconductor substrate 10 and the insulator arrangement 616 beneath the electrode arrangement 614, thus forming an inversion zone 22. The inversion zone 22 also extends to the contact zone 632 so that the minority charge carriers may be provided to a subsequent evaluation circuitry (not shown) via the contact zone 632.

The embodiments shown in FIGS. 5 and 6 have in common that they enable the formation of an inversion zone 22 which is tunable in a continuous manner, either vertically (FIG. 5) or laterally (FIG. 6) in the material of the semiconductor substrate 10.

By a continuous variation of the voltage applied to the contact 537 or 637, continuously different spectral components may be evaluated.

With the embodiments illustrated in FIGS. 5 and 6, the light may selectively be irradiated from the top (via the first main surface 101) or from the bottom (via the second main surface 102) (as was the case for other embodiments discussed above). In the case of the embodiment shown in FIG. 6, the light could also be irradiated from the side, via a side surface 103 or 104.

Figure 7:
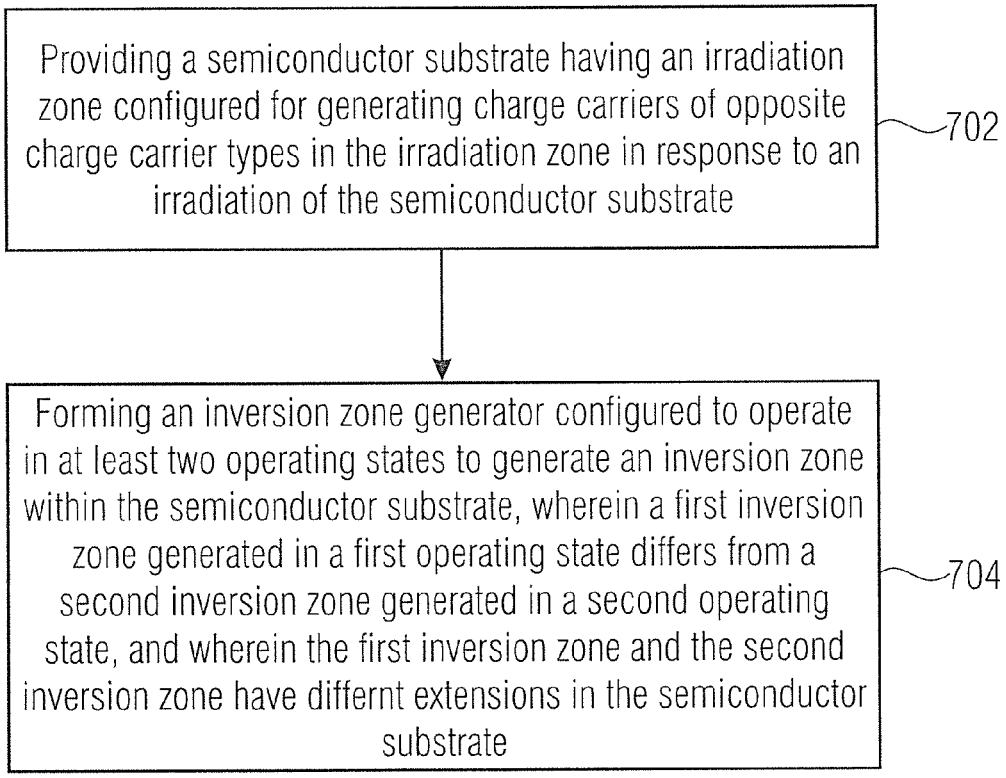
FIG. 7 shows a schematic flow diagram of a method for manufacturing a photodetector according to the teachings disclosed herein.

FIG. 7 is a schematic flow diagram of a method for manufacturing a photodetector according to the teachings disclosed herein. The schematic flow diagram only illustrates those steps or actions of the manufacturing method relative to the teachings disclosed herein. Hence, other process steps or actions are not shown as a person skilled in the art will be able to adapt an existing manufacturing process according to the teachings disclosed herein.

At a step 702 of the method for manufacturing a photodetector a semiconductor substrate is provided. The semiconductor substrate has or provides an irradiation zone which is configured for generating charge carriers of opposite charge carrier types in the irradiation zone. The generation of the charge carriers is due to an interaction of the incident irradiation with the semiconductor material of the substrate which means that the semiconductor material and, for example, its thickness should be suitably chosen in order to achieve the desired degree of interaction between the irradiation and the semiconductor substrate. Note that a dedicated structuring of the semiconductor substrate typically is not necessary in order to define the irradiation zone.

The method for manufacturing continues with the formation of an inversion zone generator, as indicated at the step 704 in FIG. 7. The inversion zone generator is configured to generate an inversion zone within the semiconductor substrate. A first inversion zone generated in a first operating state differs from a second inversion zone generated in a second operating state. The first inversion zone and the second inversion zone have different extensions in the semiconductor substrate and/or with respect to the irradiation zone of the semiconductor substrate.

In particular, the formation of the inversion zone generator may comprise a formation of an insulator arrangement within or adjacent to the irradiation zone and forming an electrode arrangement within or adjacent to the insulator arrangement at a side of the insulator arrangement opposite to the semiconductor substrate. In this manner, the electrode arrangement is insulated from the semiconductor substrate by the insulator arrangement. The forming of the insulator arrangement may comprise forming a liner oxide. The forming of the electrode arrangement may comprise forming a poly-silicon electrode material. The formation of the insulator arrangement may comprise a deposition step or an oxidation step. Also the electrode arrangement may be obtained via a deposition step or an oxidation step. Structuring manufacturing techniques, such as photolithography and/or etching may also be used in the context of the formation of the electrode arrangement and/or the insulator arrangement.

Furthermore, the forming of the insulator arrangement may comprise a step of spatially varying at least one of a dielectricity of an insulator material and a thickness of the insulator material.

According to some embodiments of the teachings disclosed herein, the method for manufacturing a photodetector may comprise the formation of at least one trench in the semiconductor substrate. The inversion zone generator or a part thereof may then be formed within the at least one trench. In particular, the inversion zone generator may be distributed among several trenches.

Forming the inversion zone generator within the at least one trench may comprise depositing an insulator material at an interior face of the trench, thereby leaving a cavity. The cavity may then be filled with an electrode material.

A wall of the trench may be doped with a doping concentration that varies from a bottom of the trench to an opening of the trench. In particular, the doping may be performed during an early stage of the manufacturing process so that the trench is structured in the variably doped semiconductor substrate. In this manner, the wall of the trench exhibits a variable doping concentration (e.g., increasing or decreasing from the bottom to the opening of the trench in a linear manner or a stepwise manner).

As an alternative to the variable doping concentration the depositing of the insulator material may create a layer of the insulator material that has a different thickness at a bottom of the trench than at an opening of the trench.

As another option for the method for manufacturing, a plurality of trenches may be formed in the semiconductor substrate. A first trench of the plurality of trenches may have a first depth and a second trench of the plurality of trenches may have a second depth different from the first depth. A first electrode of the inversion zone generator may then be formed within the first trench and a second electrode of the inversion zone generator may be formed within the second trench. During operation of the photodetector the first electrode within the first trench may be activated (i.e., an electrical potential different than the electrical potential of the semiconductor substrate is applied to the first electrode) in order to bring the inversion zone generator in a first operating state. In a second operating state the second electrode in the second trench is activated in a similar manner.

A region of the semiconductor substrate may be doped according to a single doping type to provide the irradiation zone. Instead of relying on one or more pn-junctions to separate the charge carriers of opposite charge types, as is the case with photodiodes, the separation is achieved by charge carrier concentration gradients and local electric fields. The charge carrier concentration gradients and the local electric fields are directly or indirectly caused by the inversion zone generator.

During the doping of the region of the substrate according to the single doping type at least a portion of the region may be doped with a spatially variable doping concentration.

Figure 8:
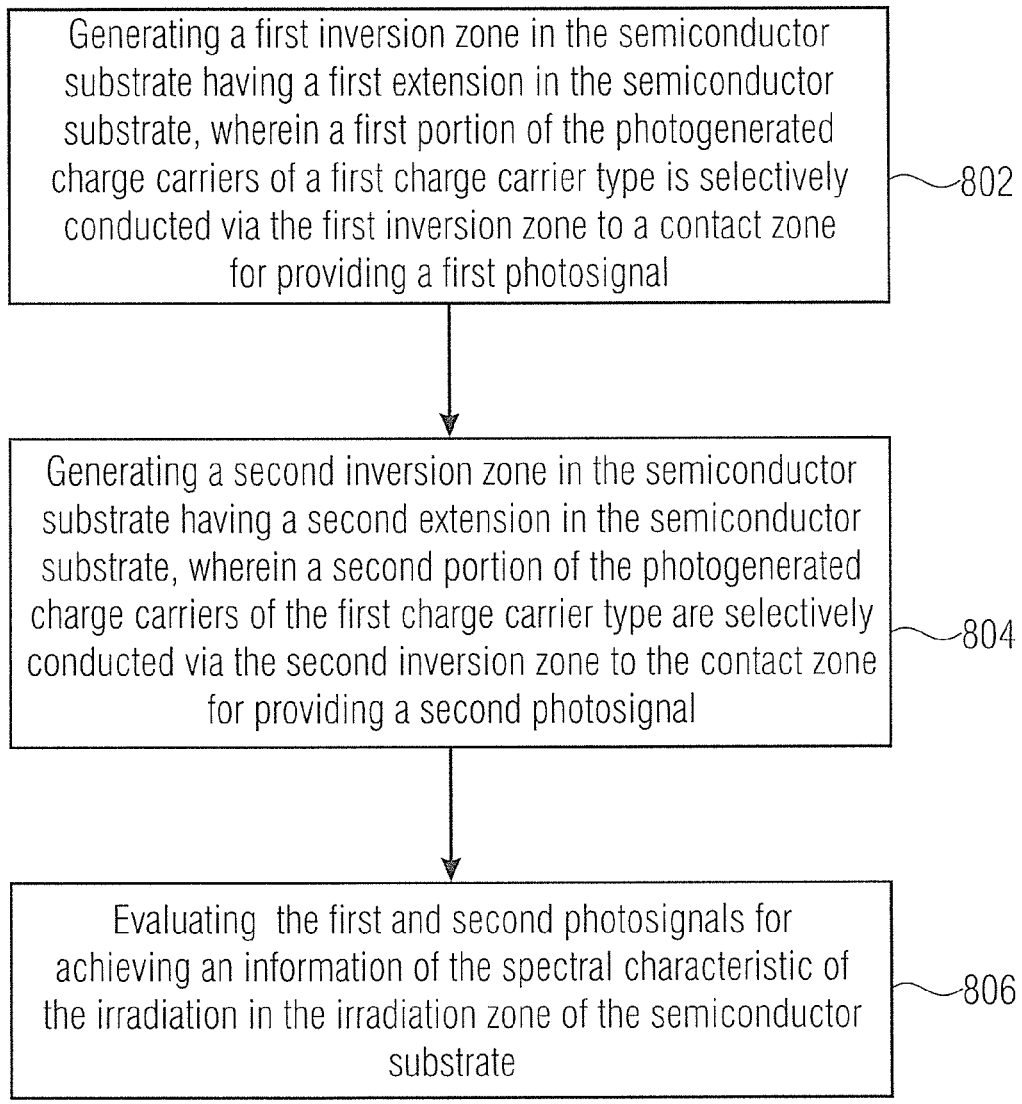
FIG. 8 shows a schematic flow diagram of a method for determining a spectral characteristic of an irradiation.

FIG. 8 illustrates a schematic flow diagram of a method for determining a spectral characteristic of an irradiation according to an embodiment of the teachings disclosed herein.

During a first operating state of an inversion zone generator which is part of a photodetector according to the teachings disclosed herein, a first inversion zone is generated in the semiconductor substrate, as indicated at 802. The first inversion zone has a first extension in the semiconductor substrate and also into the irradiation zone or with respect to the irradiation zone. As a consequence, a first portion of the photo-generated charge carriers of a first charge carrier type is selectively conducted via the first inversion zone to a contact zone for providing a first photosignal. Typically, the first inversion zone not only serves to conduct the first portion of the photogenerated charge carriers to the contact zone, but also to selectively collect the first portion from the irradiation zone. Due to the withdrawal of photogenerated charge carriers of the first charge carrier type by means of the first inversion zone and the contact zone, a concentration of the charge carriers of the first charge carrier type is at or nearly at the equilibrium concentration in the vicinity (and outside) of the first inversion zone and the adjacent depletion zone. Hence, a charge carrier concentration gradient occurs within the irradiation zone with a gradient direction pointing towards the first inversion zone. This charge carrier concentration gradient is capable of transporting (by means of diffusion) the photogenerated charge carriers of the first charge carrier type (mainly) from a first portion of the irradiation zone to the first inversion zone.

During a second operating state of the inversion zone generator a second inversion zone is generated in the semiconductor substrate, as indicated at 804. The second inversion zone has a second extension in the semiconductor substrate with respect to/into the irradiation zone, which is typically different from the first extension valid during the first operating state. Thus, a second portion of the photogenerated charge carriers of the first charge carrier type is selectively conducted via the second inversion zone to the contact zone for providing a second photosignal. In a similar manner as during the first operating state, the photogenerated charge carriers of the first charge carrier type are guided by a charge carrier concentration gradient (mainly) from a second portion of the irradiation zone to the second inversion zone.

The first and second portions of the charge carriers may be selected based on the different, adjustable extensions of the inversion zone.

At a step 806 of the method for determining the spectral characteristic of the irradiation, the first and second photosignals are evaluated for achieving or determining an information of the spectral characteristic of the irradiation in the irradiation zone of the semiconductor substrate. For example, the first and second photosignals may be evaluated in order to determine the number of photogenerated charge carriers during the first operating state and during the second operating state. From the first and second photosignals the magnitude of the irradiation in the different wavelength ranges can be determined. Depending on the configuration of the photodetector a first wavelength range corresponding to the first photosignal and a second wavelength range corresponding to the second photosignal may overlap. For example, the first wavelength range may span different wavelengths from infrared to red light, while the second wavelength range may span different wavelengths from e.g., infrared to green light (i.e., including red light). By determining a difference between the first and the second photosignals, the irradiation in the wavelength range corresponding to green light may be determined.

The method for determining the spectral characteristic may further comprise a generation of a third inversion zone in the semiconductor substrate during a third operating state. The third inversion zone has a third extension in the semiconductor substrate and/or with respect to the irradiation zone, wherein a third portion of the photogenerated charge carriers of the first charge carrier type are selectively conducted via the third inversion zone to the contact zone for providing a third photosignal.

Furthermore, the method for determining the spectral characteristic may also comprise an alternation and repetition of the generation of the first and second inversion zones and, if applicable, of the third inversion zone. The first and second photosignals (and possibly also the third photosignal) may then be evaluated for achieving the information of the spectral characteristic of the irradiation in the irradiation zone of the semiconductor substrate. A generalization to four or more operating states and four or more different inversion zones having different extensions into the irradiation zone is also possible. The method for determining the spectral characteristic according to the teachings disclosed herein may further provide a continuously adjustable inversion zone.

According to another option for the method for determining the spectral characteristic the different extensions of the different inversion zones may be continuously tunable within the semiconductor substrate and/or with respect to the irradiation zone of the semiconductor substrate. A plurality of inversion zones may be subsequently or successively generated by sweeping an inversion zone control signal. The plurality of photocurrents gathered may then be evaluated to achieve information of the spectral characteristic of the irradiation in the irradiation zone of the semiconductor substrate.

Although some aspects have been described in the context of an apparatus, it is clear that these aspects also represent a description of the corresponding methods of manufacturing and/or of determining a spectral characteristic of an irradiation, where a block or device corresponds to a method step or a feature of a method step. Analogously, aspects described in the context of a method step also represents a description of a corresponding block or item or feature of a corresponding apparatus (photodetector). Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A photodetector, comprising:
  a semiconductor substrate having an irradiation zone configured for generating charge carriers having opposite charge carrier types in response to an irradiation of the semiconductor substrate; and
  an inversion zone generator configured to operate in at least two operating states to generate different inversion zones within the substrate, wherein a first inversion zone generated in a first operating state differs from a second inversion zone generated in a second operating state, and wherein the first inversion zone and the second inversion zone have different extensions in the semiconductor substrate;
  wherein the inversion zone generator comprises an electrode arrangement configured to create an electrical field within the semiconductor substrate in order to generate the inversion zone, and an insulator arrangement configured to insulate the electrode arrangement against the semiconductor substrate; and
  wherein the electrode arrangement and the insulator arrangement extend along a direction substantially lateral to a main surface of the semiconductor substrate.

2. The photodetector according to claim 1, wherein the first inversion zone and the second inversion zone have different extensions in or with respect to the irradiation zone.

3. The photodetector according to claim 1, wherein the inversion zone generator is configured to generate a first depletion zone for separating two conjointly photogenerated charge carriers of opposite charge carrier types, the first depletion zone being adjacent to the first inversion zone, and to generate a second depletion zone for separating two conjointly photogenerated charge carriers of opposite charge carrier types, the second depletion zone being adjacent to the second inversion zone.

4. The photodetector according to claim 1, wherein, in response to a photogeneration of the charge carriers in the irradiation zone, a charge carrier concentration gradient is formed in the irradiation zone in a direction to the first inversion zone and a first depletion zone adjacent thereto in the first operating state, and in direction to the second inversion zone and a second depletion zone adjacent thereto in the second operating state.

5. The photodetector according to claim 1, further comprising a contact zone configured for providing the photogenerated charge carriers of a first charge carrier type, wherein, in the first operating state, the first inversion zone is configured to selectively collect a first portion of the photogenerated charge carriers of the first charge carrier type and to conduct the collected first portion of the photogenerated charge carriers to the contact zone, and wherein, in the second operating state, the second inversion zone is configured to selectively collect a second portion of the photogenerated charge carriers of the first charge carrier type and to conduct the collected second portion of the photogenerated charge carriers to the contact zone.

6. The photodetector according to claim 1, wherein the insulator arrangement comprises a liner oxide.

7. The photodetector according to claim 1, wherein the electrode arrangement comprises a poly-silicon electrode material.

8. The photodetector according to claim 1, wherein the semiconductor substrate in the irradiation zone comprises a single doping type semiconductor material.

9. The photodetector according to claim 8, wherein the single doping type material extends from the inversion zone generator for at least a tenth of a diffusion length of a first charge carrier type within the single doping type material.

10. The photodetector according to claim 1, wherein the inversion zone generator has a main interface with the semiconductor substrate and wherein at least one of the following properties varies in a direction parallel to the interface:
    a dielectricity of an insulating arrangement between the inversion zone generator and the semiconductor substrate; and
    a thickness of the insulating arrangement between the inversion zone generator and the semiconductor substrate.

11. The photodetector according to claim 1, wherein the semiconductor substrate in the irradiation zone comprises a single doping type semiconductor material, wherein the inversion zone generator has a main interface with the semiconductor substrate, and wherein a doping concentration of the single doping type material varies in a direction parallel to the interface.

12. The photodetector according to claim 11, wherein the doping concentration varies in a continuous manner.

13. The photodetector according to claim 1, wherein the irradiation zone does not comprise a pn-junction.

14. The photodetector according to claim 1, further comprising an inversion zone controller configured to provide a control signal to the inversion zone generator for controlling at least one of a shape and a location of the inversion zone.

15. The photodetector according to claim 1, wherein the semiconductor substrate is configured to receive the irradiation from a side or backside of the substrate.

16. The photodetector according to claim 1, further comprising an evaluation circuit configured to evaluate the photogenerated charge carriers obtained from the first inversion zone and the second inversion zone.

17. The photodetector according to claim 16, further comprising:
    a substrate contact connected to the evaluation circuit and configured to contact a region of the substrate to which the first inversion zone and the second inversion zone do not extend; and
    a contact zone connected to the evaluation circuit and configured for providing the photogenerated charge carriers to the evaluation circuit, wherein, in the first operating state, the first inversion zone is configured to conduct the photogenerated charge carriers from the irradiation zone to the contact zone, and wherein, in the second operating state, the second inversion zone is configured to conduct the photogenerated charge carriers from the irradiation zone to the contact zone.

18. The photodetector according to claim 1, wherein the inversion zone generator is configured to operate in a plurality of different operating states to generate a plurality of different inversion zones within the semiconductor substrate, wherein the different extensions of the different inversion zones are continuously tunable with respect to the irradiation zone of the semiconductor substrate.

19. A photodetector, comprising:
    a semiconductor substrate having an irradiation zone configured for generating charge carriers having opposite charge carrier types in response to an irradiation of the semiconductor substrate;
    an inversion zone generator configured to operate in a plurality of different operating states to generate a plurality of different inversion zones within the semiconductor substrate, wherein the different extensions of the different inversion zones are continuously tunable in the semiconductor substrate
    wherein the inversion zone generator comprises an electrode arrangement configured to create an electrical field within the semiconductor substrate in order to generate the inversion zone, and an insulator arrangement configured to insulate the electrode arrangement against the semiconductor substrate; and
    wherein the electrode arrangement and the insulator arrangement extend along a direction substantially lateral to a main surface of the semiconductor substrate.

20. A method for determining a spectral characteristic of an irradiation in an irradiation zone of a semiconductor substrate, the method comprising:
    generating a first inversion zone in the semiconductor substrate having a first extension in the semiconductor substrate laterally to a main surface of the semiconductor substrate, wherein a first portion of the photogenerated charge carriers of a first charge carrier type is selectively conducted via the first inversion zone to a contact zone for providing a first photosignal;
    generating a second inversion zone in the semiconductor substrate having a second extension in the semiconductor substrate laterally to the main surface of the semi-conductor substrate, wherein a second portion of the photogenerated charge carriers of the first charge carrier type are selectively conducted via the second inversion zone to the contact zone for providing a second photosignal; and evaluating the first and second photosignals for achieving an information of the spectral characteristic of the irradiation in the irradiation zone of the semiconductor substrate.

* * * * *